(12) United States Patent
Kim et al.

(10) Patent No.: US 8,278,161 B2
(45) Date of Patent: Oct. 2, 2012

(54) METHOD FOR FABRICATING A THIN FILM TRANSISTOR ARRAY SUBSTRATE WITH A THINNED PROTECTIVE FILM OVER A STORAGE CAPACITOR

(75) Inventors: Sung Jin Kim, Daegu (KR); Woo Young Choi, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/019,063

(22) Filed: Jan. 24, 2008

(65) Prior Publication Data
US 2008/0113475 A1 May 15, 2008

Related U.S. Application Data

(62) Division of application No. 11/293,888, filed on Dec. 2, 2005, now abandoned.

(30) Foreign Application Priority Data

Dec. 3, 2004 (KR) .............................. P2004-101447

(51) Int. Cl.
*H01L 21/32* (2006.01)
*H01L 21/335* (2006.01)

(52) U.S. Cl. ......... 438/151; 257/E29.117; 257/E29.273; 345/92

(58) Field of Classification Search .................. 438/151; 345/92; 257/E29.117, E29.151, E29.273, 257/E29.276, 59, 72, 291, E29.147, E27.112
See application file for complete search history.

(56) References Cited

U.S. PATENT DOCUMENTS

| | | | |
|---|---|---|---|
| 5,737,049 A * | 4/1998 | Shin et al. | 349/122 |
| 6,335,276 B1 * | 1/2002 | Park et al. | 438/648 |
| 2001/0010567 A1 * | 8/2001 | Rho et al. | 349/43 |
| 2003/0007108 A1 * | 1/2003 | Hwang et al. | 349/43 |
| 2004/0048407 A1 * | 3/2004 | Lee | 438/30 |
| 2004/0095521 A1 * | 5/2004 | Song et al. | 349/61 |
| 2004/0189919 A1 * | 9/2004 | Ahn et al. | 349/141 |
| 2007/0002265 A1 * | 1/2007 | Kwak et al. | 349/156 |

OTHER PUBLICATIONS

English Translation of Office Action issued in corresponding Korean Patent Application No. 10-2004-101447, mailed Mar. 8, 2011 (cited on previous IDS).

* cited by examiner

*Primary Examiner* — Tom Thomas
*Assistant Examiner* — Christopher M Roland
(74) *Attorney, Agent, or Firm* — Brinks Hofer Gilson & Lione

(57) ABSTRACT

A thin film transistor array substrate and a fabricating method are disclosed. A gate line and a data line cross each other and a thin film transistor (TFT) is provided at the intersection between the gate and data lines. A protective film covers the data line and the thin film transistor and has a contact hole exposing a drain electrode of the TFT. A pixel electrode is connected, via the contact hole, to the drain electrode of the TFT. A storage capacitor includes a gate insulating film between the pixel electrode and the gate line and/or a common line. Some or all of the protective film within the storage capacitor is removed such that the storage capacitor contains no protective film or a layer of protective film that is thinner than the portion covering the TFT.

8 Claims, 19 Drawing Sheets

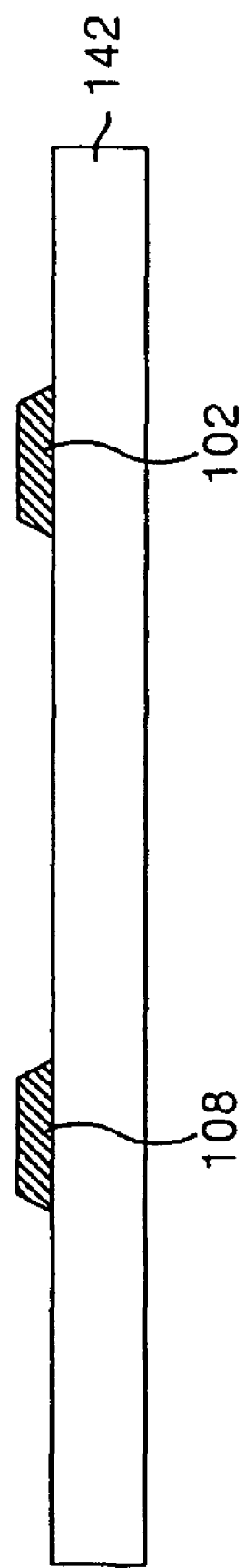

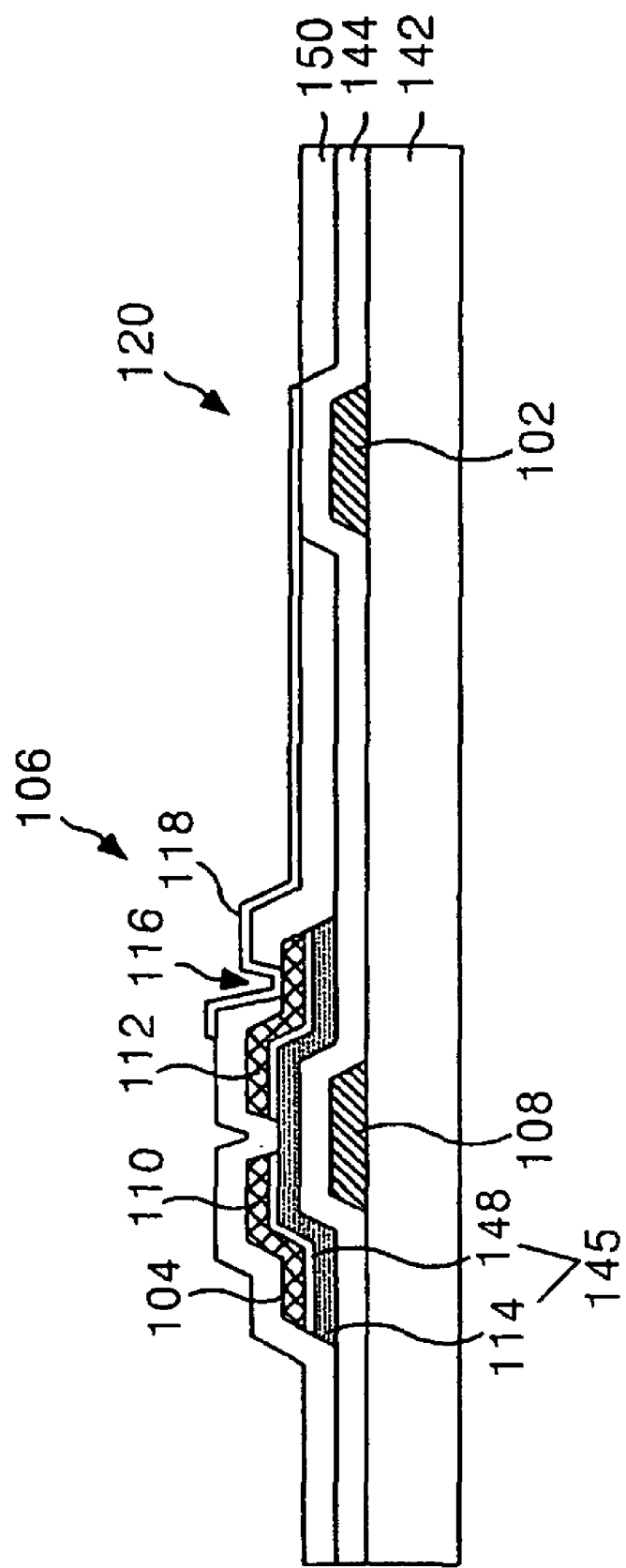

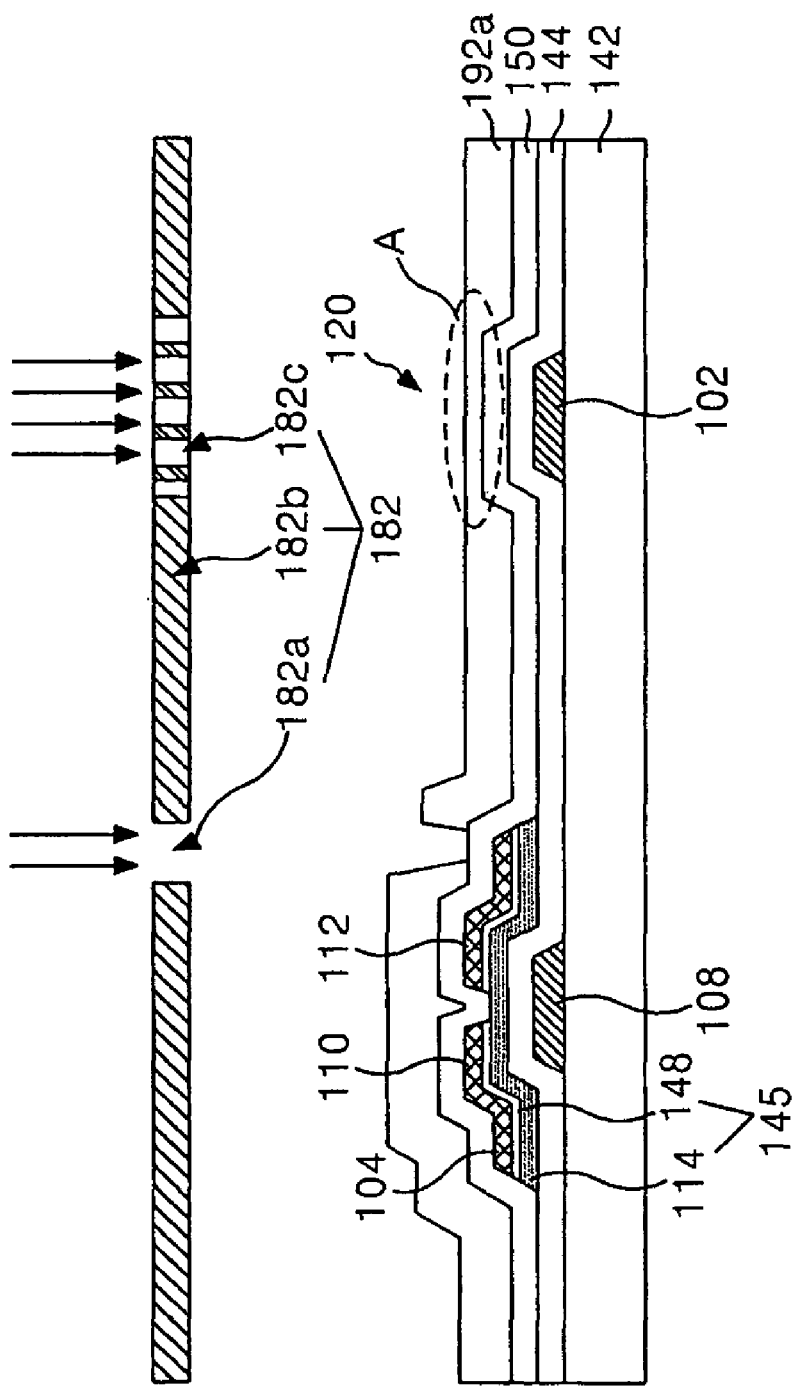

METHOD FOR FABRICATING A THIN FILM TRANSISTOR ARRAY SUBSTRATE WITH A THINNED PROTECTIVE FILM OVER A STORAGE CAPACITOR

RELATED APPLICATIONS

This application claims the benefit of U.S. patent application Ser. No. 11/293,888, which claims priority to Korean Patent Application No. 2004-101447, filed on Dec. 3, 2004, both of which are incorporated by reference.

TECHNICAL FIELD

The present invention relates to a thin film transistor array substrate, and more particularly to a thin film transistor array substrate and a fabricating method thereof that are adaptive for minimizing a residual image to thereby improve picture quality.

DESCRIPTION OF THE RELATED ART

Generally, a liquid crystal display (LCD) controls light transmittance of a liquid crystal using an electric field to thereby display a picture. To this end, the LCD includes a liquid crystal display panel having liquid crystal cells arranged in a matrix, and a driving circuit for driving the liquid crystal display panel. 2. Background Information The liquid crystal display panel includes a thin film transistor array substrate and a color filter array substrate opposed to each other, a liquid crystal injected between two substrates, and a spacer for keep a cell gap between two substrates.

The color filter array substrate consists of color filters formed for each liquid crystal cell, black matrices for dividing the color filters and reflecting external light, common electrodes for commonly applying reference voltages to the liquid crystal cells, and an alignment film coated thereon.

The liquid crystal display panel is completed by preparing the thin film array substrate and the color filter array substrate individually, joining them together, injecting liquid crystal between the joined substrates, and sealing the joined substrates.

FIG. 1 is a plan view illustrating a related art thin film transistor array substrate, and FIG. 2 is a section view of the thin film transistor array substrate taken along the I-I' line in FIG. 1.

Referring to FIG. 1 and FIG. 2, the thin film transistor array substrate includes a gate line 2 and a data line 4 provided on a lower substrate 42 to intersect each other with the gate insulating film 44 therebetween, a thin film transistor 6 provided at each intersection, and a pixel electrode 18 provided at a cell area having a crossing structure. Further, the thin film transistor array substrate includes a storage capacitor 20 provided at an overlapped portion between the pixel electrode 18 and the pre-stage gate line 2. The thin film transistor 6 includes a gate electrode 8 connected to the gate line 2, a source electrode 10 connected to the data line 4, a drain electrode 12 connected to the pixel electrode 18, and an active layer 14 overlapping the gate electrode 8 and defining a channel between the source electrode 10 and the drain electrode 12. The active layer 14 is provided to overlap with the data line 4, the source electrode 10 and the drain electrode 12, and further includes a channel portion between the source electrode 10 and the drain electrode 12. On the active layer 14, an ohmic contact layer 48 is deposited for making an ohmic contact with the data line 4, the source electrode 10, the drain electrode 12.

The thin film transistor 6 allows a pixel voltage signal applied to the data line 4 to be charged into the pixel electrode 18 and kept in response to a gate signal applied to the gate line 2.

The pixel electrode 18 is connected, via a first contact hole 16 passing through a protective film 50, to the drain electrode 12 of the thin film transistor 6. The pixel electrode 18 generates a potential difference with respect to a common electrode provided at an upper substrate (not shown) by the charged pixel voltage signal. This potential difference rotates a liquid crystal positioned between the thin film transistor array substrate and the upper substrate owing to dielectric anisotropy of the liquid crystal and transmits light inputted, via the pixel electrode 18, from a light source (not shown) toward the upper substrate.

The storage capacitor 20 is formed by a pre-stage gate line 2 and a pixel electrode 18. The gate insulating film 44 and the protective film 50 are located between the gate line 2 and the pixel electrode 18. The storage capacitor 20 allows a pixel voltage signal charged in the pixel electrode 18 to be stably maintained until the next pixel voltage is charged.

Hereinafter, a method of fabricating the thin film transistor substrate will be described in detail with reference to FIG. 3A to FIG. 3D.

Firstly, a gate metal layer is formed on the lower substrate 42 by a deposition technique such as sputtering. Then, the gate metal layer is patterned by photolithography and etching using a first mask to thereby form gate metal patterns including the gate line 2, the gate electrode 8 as shown FIG. 3A.

Next, the gate insulating film 44, an amorphous silicon layer, a n+ amorphous silicon layer and a source/drain metal layer are sequentially provided on the lower substrate 42 provided with the gate metal patterns by deposition techniques such as plasma enhanced chemical vapor deposition (PECVD) and sputtering, etc.

Then, a source/drain pattern including the data line 4, the source electrode 10 and the drain electrode 12 is formed on the source/drain metal layer by photolithography and etching using a diffractive exposure mask; and a semiconductor pattern 45 including the active layer 14 and the ohmic contact layer 48 is formed at the lower portion of the source/drain pattern.

Alternatively, the semiconductor pattern 45 may be provided individually with the source/drain pattern using a separate mask process.

The protective film 50 is entirely formed on the gate insulating film 44 provided with the source/drain pattern by a deposition technique such as PECVD, etc. Thereafter, the protective film 50 is patterned by photolithography and etching to thereby provide a contact hole 16 as shown FIG. 3C. The contact hole 16 passes through the protective film 50 and exposes the drain electrode 12.

A transparent electrode material is entirely deposited onto the protective film 50 by a deposition technique such as sputtering, etc. Thereafter, the transparent electrode material is patterned by photolithography and etching to thereby provide the pixel electrode 18 as shown FIG. 3D. The pixel electrode 18 is electrically connected, via the first contact hole 16, to the drain electrode 12. Further, the pixel electrode 18 overlaps the pre-stage gate line 2 with the gate insulating film 44 and the protective film 50 therebetween, thereby providing the storage capacitor 20.

In the TFT array substrate, as shown in FIG. 4, the gate electrode 8 of the TFT 6 is supplied with a gate voltage (Vg) and the source electrode 10 thereof is supplied with a data voltage Vd. If a gate voltage more than a threshold voltage is applied to a gate voltage 8 of the TFT 6, then a channel is formed between the source electrode 10 and the drain electrode 12. In this case, the data voltage Vd is charged, via the source electrode 10 and the drain electrode 12 of the TFT 6, into the liquid crystal cell Clc and the storage capacitor 20 Cst.

Herein, a feed-through Voltage $\Delta$Vp, that is, a difference between the data voltage Vd and a voltage Vlc charged in the liquid crystal cell Clc is defined by the following equation:

$$\Delta Vp = \frac{Cgd}{Cgd + Clc + Cst} \Delta Vg \qquad (1)$$

wherein Cgd is a parasitic capacitor formed between the gate terminal and the drain terminal of the TFT; and $\Delta$Vg is a difference voltage between a voltage Vgh and a voltage Vgl.

Such a feed-through voltage $\Delta$Vp causes a deterioration of picture quality such as a residual image, for example, a flicker. Accordingly, studies have been undertaken for reducing the deterioration of picture quality by maximizing the capacitance Cst of the storage capacitor 120 in order to minimize the feed-through voltage $\Delta$Vp as indicated in the above equation (1). However, as the capacitance Cst of the storage capacitor 120 increases, an area occupied by the storage capacitor 120 increases commensurately. This reduces the aperture ratio of the pixel. Furthermore, if a thickness of the protective film 50 and the gate insulating film 44 is reduced, then the amount of insulation provided by the gate insulating film 44 and the protective film 50 decreases.

SUMMARY

By way of introduction only, a thin film transistor array substrate according to one aspect of the present invention includes a gate line and a data line crossing each other; a thin film transistor provided at each intersection between the gate line and the data line; a storage capacitor including another gate line and/or a common line separated from the gate line; a protective film that covers the data line and the thin film transistor and the at least one of the other gate line or the common line in the storage capacitor, the protective film in the storage capacitor thinner than the protective film that covers the data line and the thin film transistor, the protective film having a contact hole exposing a drain electrode of the thin film transistor; and a pixel electrode connected, via the contact hole, to the drain electrode of the thin film transistor, the pixel electrode forming one electrode of the storage capacitor.

A method of fabricating a thin film transistor array substrate according to another aspect of the present invention includes forming a gate line and a common line and/or another gate line separated from the gate line on a substrate; forming a data line crossing the gate line and a thin film transistor provided at the intersection between the gate line and the data line; forming a protective film covering the thin film transistor; removing a portion of the protective film to form a contact hole exposing a drain electrode of the thin film transistor and at least thin the protective film in a storage capacitor area; and forming a pixel electrode connected, via the contact hole, to the drain electrode of the thin film transistor, a storage capacitor being formed that includes the pixel electrode and at least one of the common line or the other gate line In another embodiment, a liquid crystal display includes a thin film transistor array substrate, a substrate that opposes the thin film transistor array substrate, and liquid crystal between the substrates. The thin film transistor array substrate includes: a first gate line and a data line crossing each other on a transparent substrate; a thin film transistor provided at an intersection of the first gate line and the data line; a protective film that covers the data line and the thin film transistor; a gate insulating film that covers the first gate line; and a pixel electrode connected to a drain electrode of the thin film transistor. The pixel electrode is separated from a conductive material by an insulator to form a storage capacitor in a storage capacitor area. The insulator includes the protective film and/or the gate insulating film. The thickness of the insulator in the storage capacitor area is thinner than a combined thickness of the protective film and the gate insulating film outside the storage capacitor area.

BRIEF DESCRIPTION OF THE DRAWINGS

The following detailed description of the embodiments of the present invention reference the accompanying drawings in which:

FIG. 9A to FIG. 9C are section views illustrating a method of fabricating the thin film transistor substrate according to a second embodiment of the present invention.

DETAILED DESCRIPTION OF THE EMBODIMENTS

Hereinafter, the preferred embodiments of the present invention will be described in detail with reference to FIG. 5 to FIG. 10.

Figure 1:
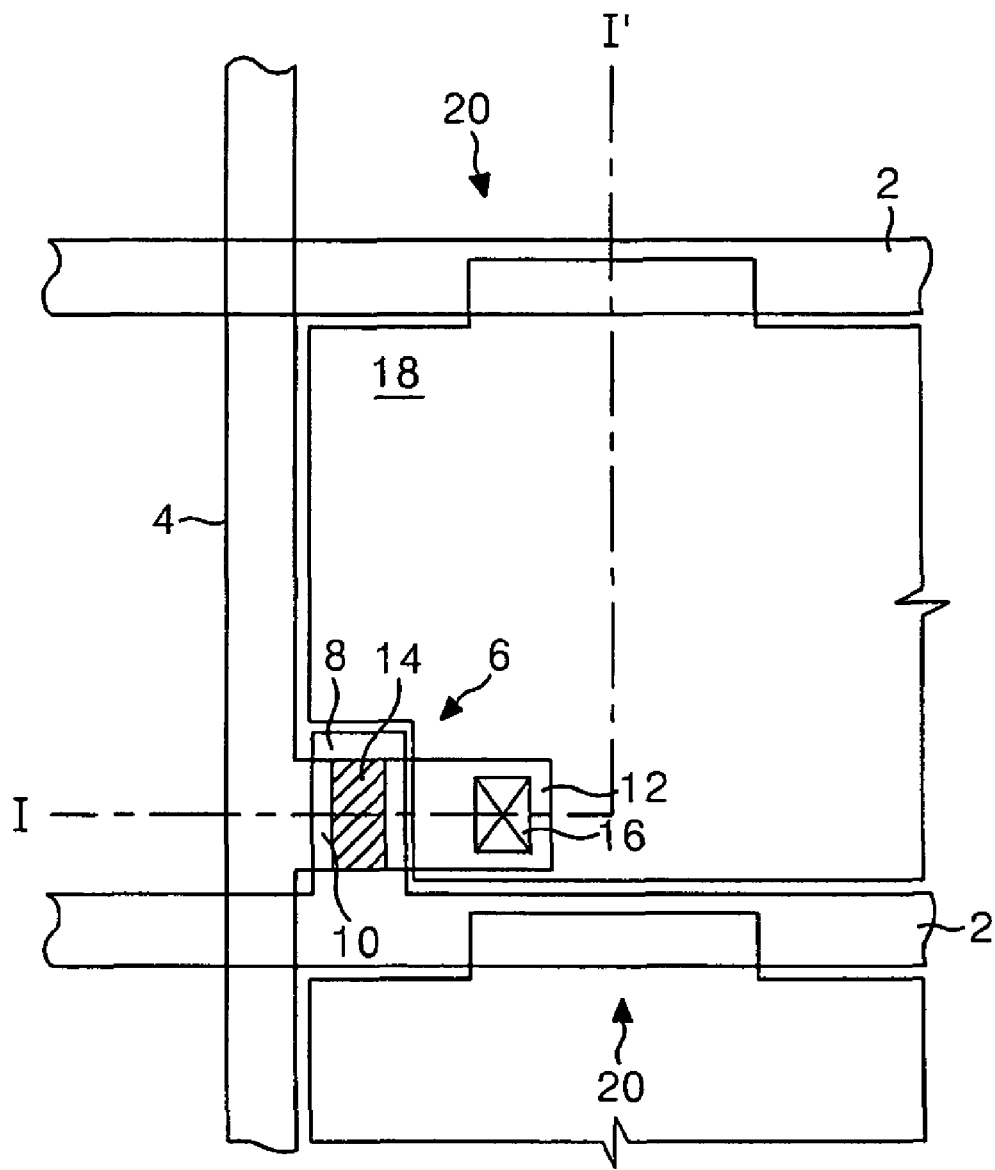
FIG. 1 is a plan view showing a portion of a related art thin film transistor array substrate.
Figure 2:
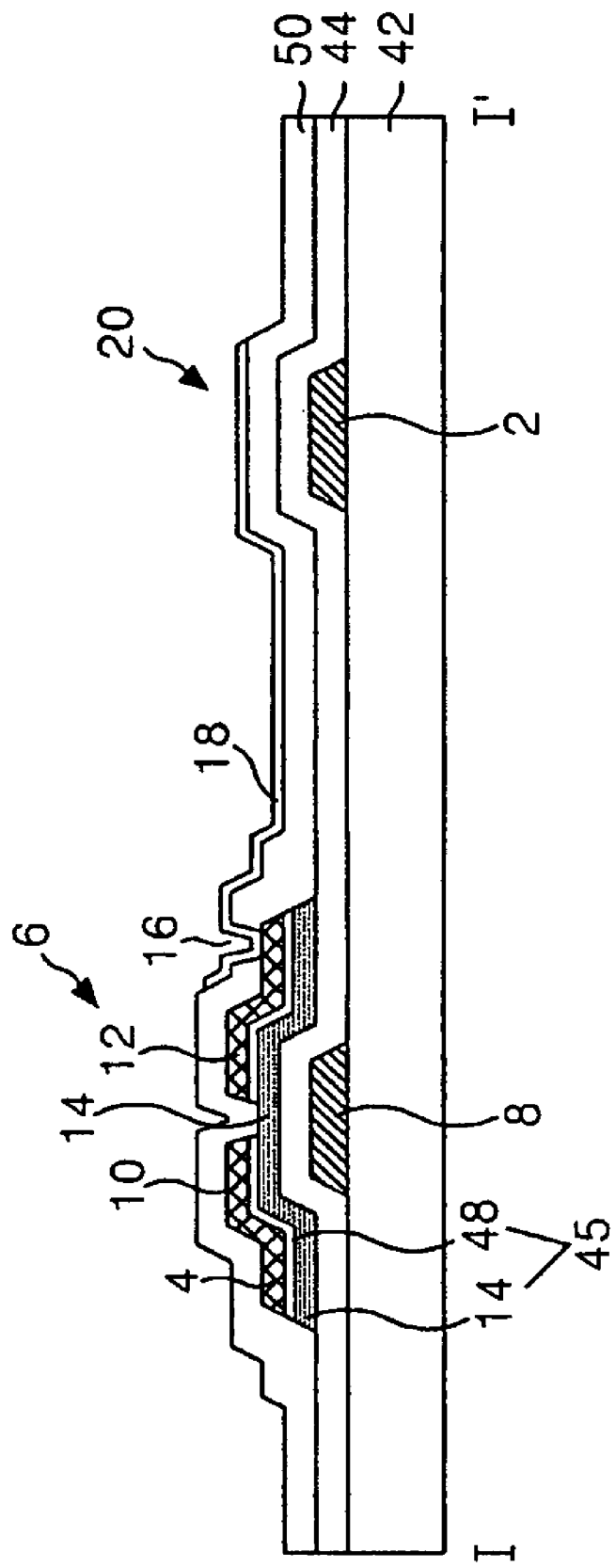
FIG. 2 is a section view of the thin film transistor array substrate taken along the I-I' line in FIG. 1.
Figure 3A:
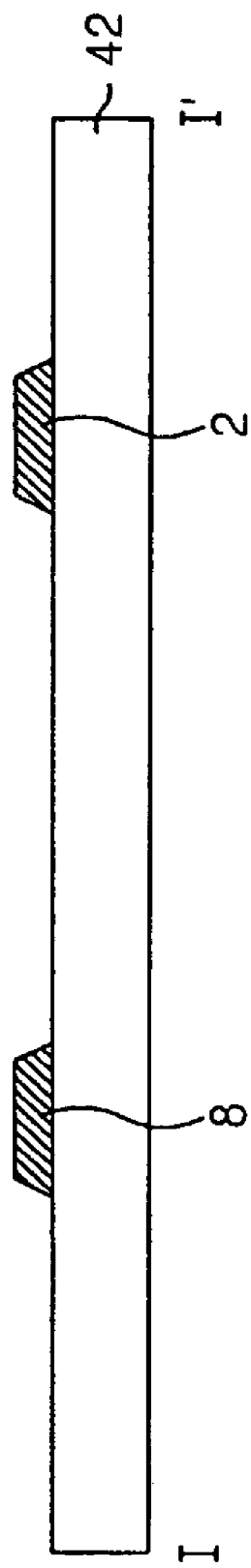
FIG. 3A to FIG. 3D are section views illustrating a method of fabricating the thin film transistor substrate shown in FIG. 2.
Figure 3B:
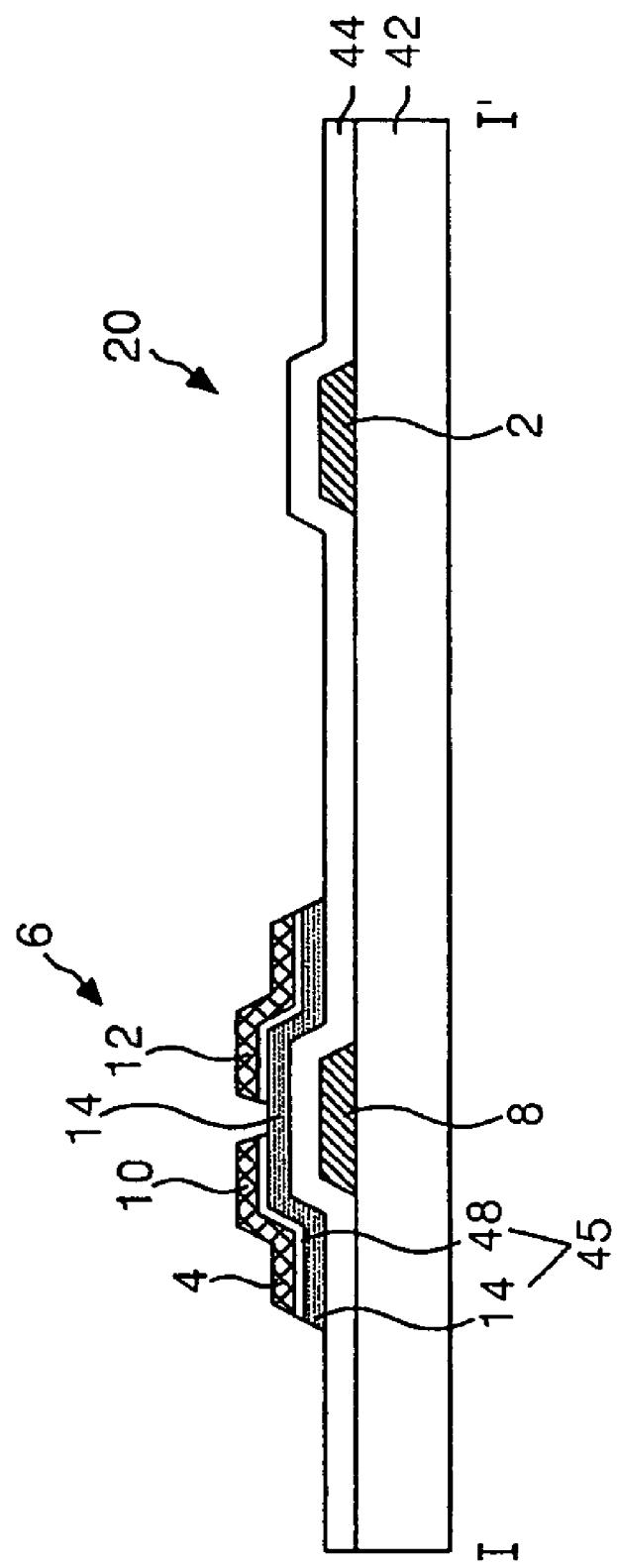
Figure 3C:
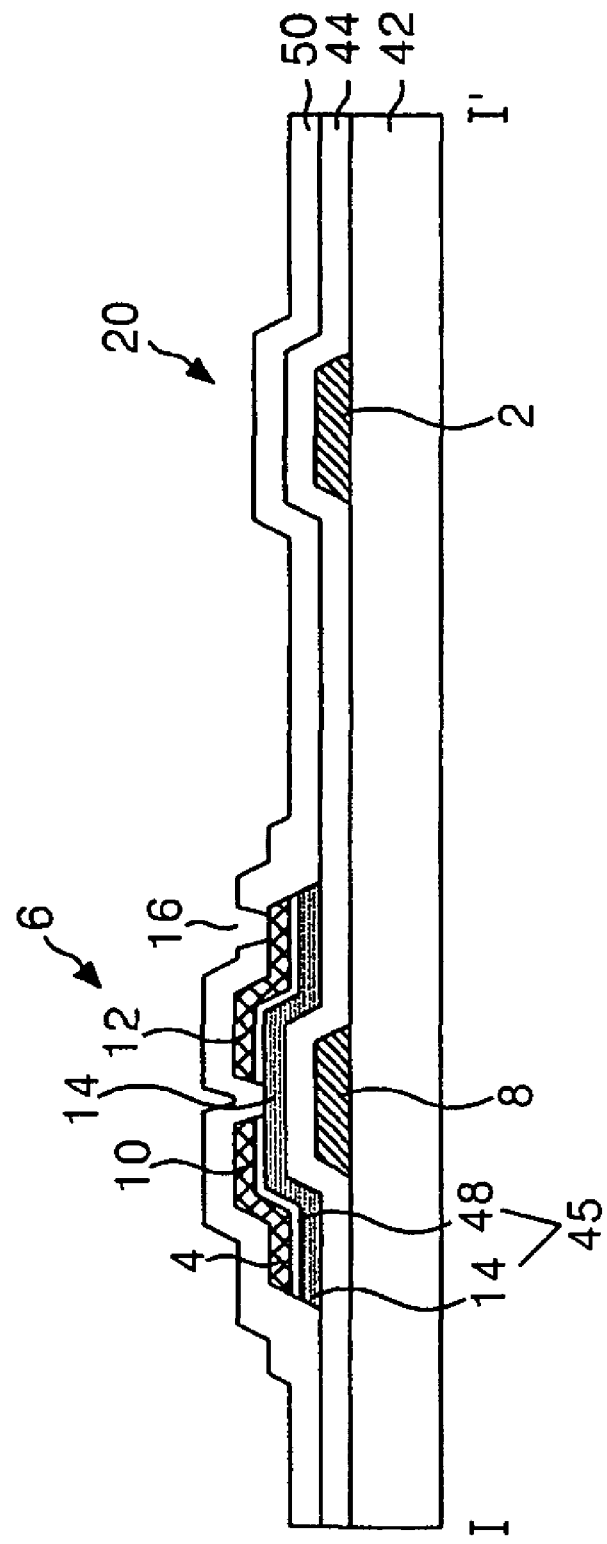
Figure 3D:
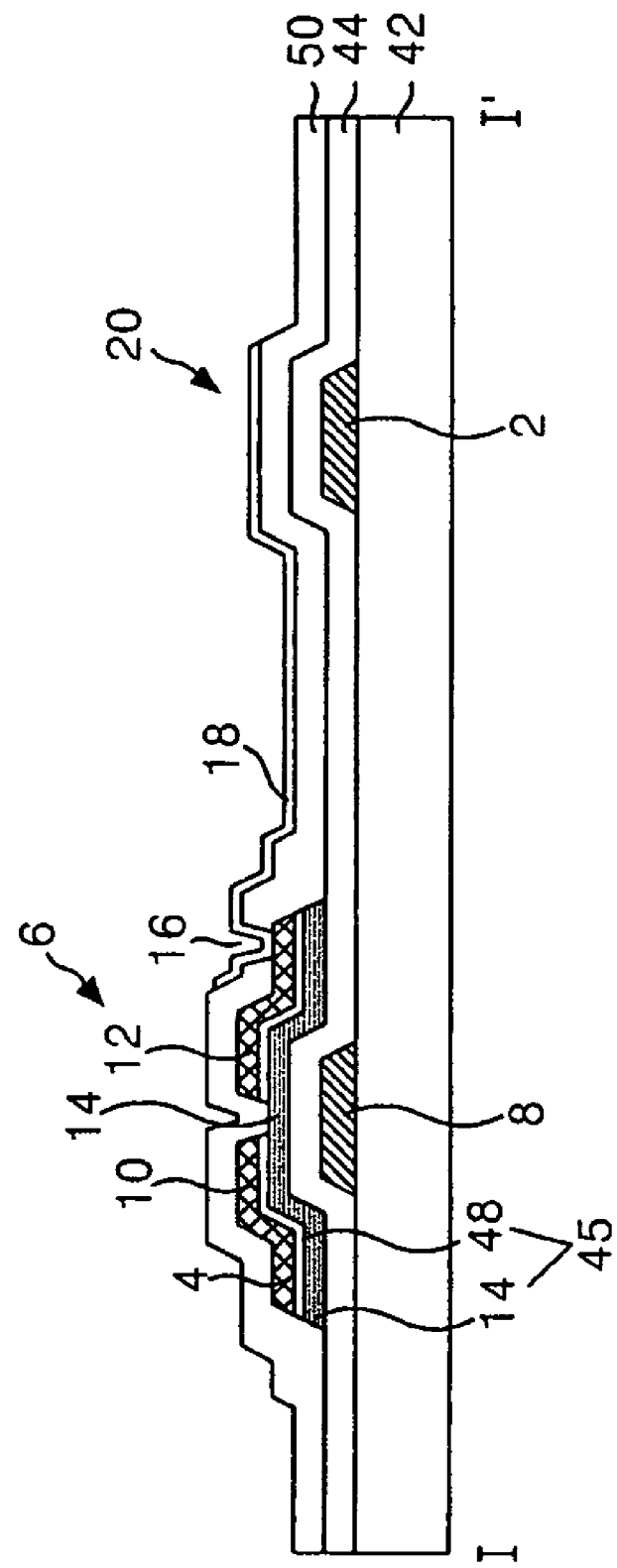
Figure 4:
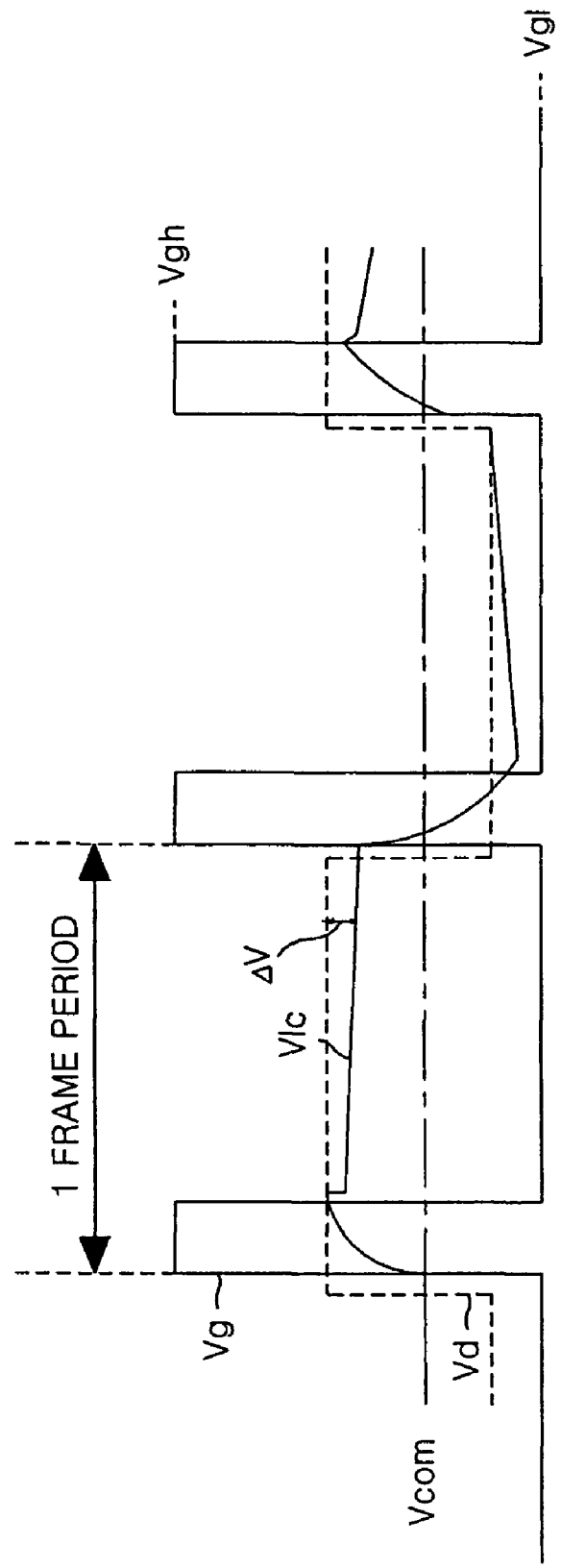
FIG. 4 is a waveform diagram of a voltage applied to the liquid crystal panel.
Figure 5:
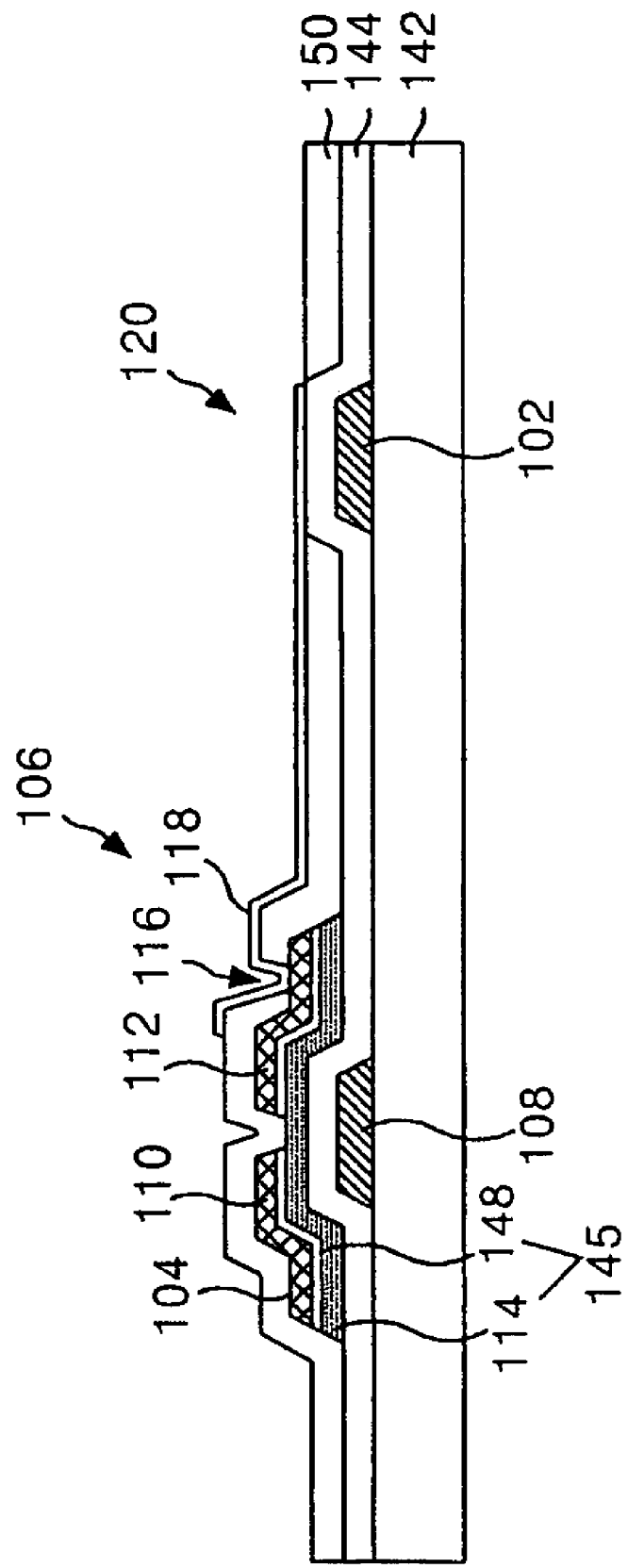
FIG. 5 is a section view showing a portion of a thin film transistor array substrate according to a first embodiment of the present invention.

FIG. 5 is a section view showing a thin film transistor array substrate according to a first embodiment of the present invention.

Referring to FIG. 5, the thin film transistor array substrate includes a gate line 102 and a data line 104 provided on a lower substrate 142 to intersect each other with a gate insulating film 144 therebetween, a thin film transistor 106 provided at each intersection, and a pixel electrode 118 provided at a cell area having a crossing structure. Further, the thin film transistor array substrate includes a storage capacitor 120 provided at an overlapped portion between the pixel electrode 118 and the pre-stage gate line 102. The thin film transistor 106 includes a gate electrode 108 connected to the gate line 102, a source electrode 110 connected to the data line 104, a drain electrode 112 connected to the pixel electrode 118, and an active layer 114 overlapping the gate electrode 108 and defining a channel between the source electrode 110 and the drain electrode 112. The active layer 114 overlaps the data line 104, the source electrode 110 and the drain electrode 112 and has a channel portion between the source electrode 110 and the drain electrode 112. On the active layer 114, an ohmic contact layer 148 is deposited for making ohmic contact with the data line 104, the source electrode 110, and the drain electrode 112.

The thin film transistor 106 allows a pixel voltage signal applied to the data line 104 to be charged into the pixel electrode 118 and kept in response to a gate signal applied to the gate line 102.

The pixel electrode 118 is connected, via a first contact hole 116 passing through a protective film 150, to the drain electrode 112 of the thin film transistor 106. The pixel electrode 118 generates a potential difference with respect to a common electrode provided at an upper substrate (not shown) by the charged pixel voltage signal. This potential difference rotates a liquid crystal positioned between the thin film transistor array substrate and the upper substrate owing to dielectric anisotropy of the liquid crystal and transmits light inputted, via the pixel electrode 118, from a light source (not shown) toward the upper substrate. The storage capacitor 120 is formed by the storage electrode 118 and the pre-stage gate line 102. The gate insulating film 144 is located between the gate line 102 and the pixel electrode 118.

The protective film 150 is not located in the storage capacitor 120. Thus, a feed-through voltage ΔVp is minimized. Accordingly, a residual image such as flicker is minimized to improve a picture quality.

Hereinafter, this will be described in more detail

Generally, a capacitance value of the capacitor is in proportion to a section area of the electrode while being in inverse proportion to a distance between the electrodes as indicated in the following equation:

$$C \sim A/d \quad (2)$$

wherein C represents a capacitance value of the capacitor; A represents an area of the capacitor; and d represents a distance between the electrodes of the capacitor.

In the first embodiment of the present invention, the protective film 150 is not present on the gate insulating film 144 in the storage capacitor 120. Accordingly, since a distance between the pixel electrode 118 and the gate electrode 102 is reduced, a capacitance value Cst of the storage capacitor 120 is increased. The capacitance Cst of the storage capacitor 120 plays a role to reduce a feed-through voltage ΔVp as indicated in the following equation:

$$\Delta Vp = \frac{Cgd}{Cgd + Clc + Cst} \Delta Vg \quad (3)$$

As a result, the feed-through voltage ΔVp is minimized. Thus, a residual image problem such as flicker can be minimized to improve the picture quality.

Hereinafter, a method of fabricating the thin film transistor substrate will be described in detail with reference to FIG. 6A to FIG. 6D.

Firstly, a gate metal layer is formed on the lower substrate 142 by a deposition technique such as sputtering. Then, the gate metal layer is patterned by photolithography and etching using a first mask to thereby provide gate metal patterns including the gate line 102, the gate electrode 108 as shown FIG. 6A. The gate metal layer may be a single-layer or multiple-layer structure of chrome (Cr), molybdenum (Mo) or an aluminum group metal, etc.

The gate insulating film 144 is formed on the lower substrate 142 provided with the gate pattern by deposition techniques such as plasma enhanced chemical vapor deposition (PECVD) and sputtering, etc. The gate insulating film 144 is formed from an inorganic insulating material such as silicon oxide (SiOx) or silicon nitride (SiNx).

An amorphous silicon layer, an n+ amorphous silicon layer and a source/drain metal layer are sequentially provided on the lower substrate 142 provided with the gate insulating film 142.

A photo-resist pattern is formed on the source/drain metal layer by photolithography using a mask. Herein, the mask has a diffractive exposure part at the channel portion of the thin film transistor 106, thereby allowing the photo-resist pattern at the channel portion to have a lower height than at the source/drain regions.

Subsequently, the source/drain metal layer is patterned by wet etching using the photo-resist pattern to thereby provide source/drain patterns including the data line 104, the source electrode 110, and the drain electrode 112, which is integral with the source electrode 110.

Next, the amorphous silicon layer and the n+ amorphous silicon layer are simultaneously patterned by dry etching using the same photo-resist pattern to thereby provide the semiconductor pattern 145 including the ohmic contact layer 148 and the active layer 114.

Further, the photo-resist pattern having a relatively low height at the channel portion is removed by ashing, and thereafter the source/drain pattern and the ohmic contact layer 148 at the channel portion is etched by dry etching. Thus, the active layer 114 at the channel portion is exposed to disconnect the source electrode 110 from the drain electrode 112 as shown FIG. 6B.

Then, the photo-resist pattern left on the source/drain pattern group is removed by stripping. Herein, the source/drain metal is selected from molybdenum (Mo), titanium (Ti), tantalum (Ta) or a molybdenum alloy, Cu, an aluminum group metal etc.

Alternatively, the semiconductor pattern 145 may be formed individually with the source/drain pattern using a separate mask process.

The protective film 150 is entirely formed on the gate insulating film 144 provided with the source/drain patterns by a deposition technique such as PECVD, etc. The protective film 150 is patterned by photolithography and etching using a mask to thereby define a contact hole 116. The contact hole 116 passes through the protective film 150 and exposes the drain electrode 112. The gate insulating film 144 is exposed at an area provided with the storage capacitor.

Hereinafter, a method of fabricating the protective film 150 will be described in detail with reference to FIG. 7A to FIG. 7B.

Figure 7A:
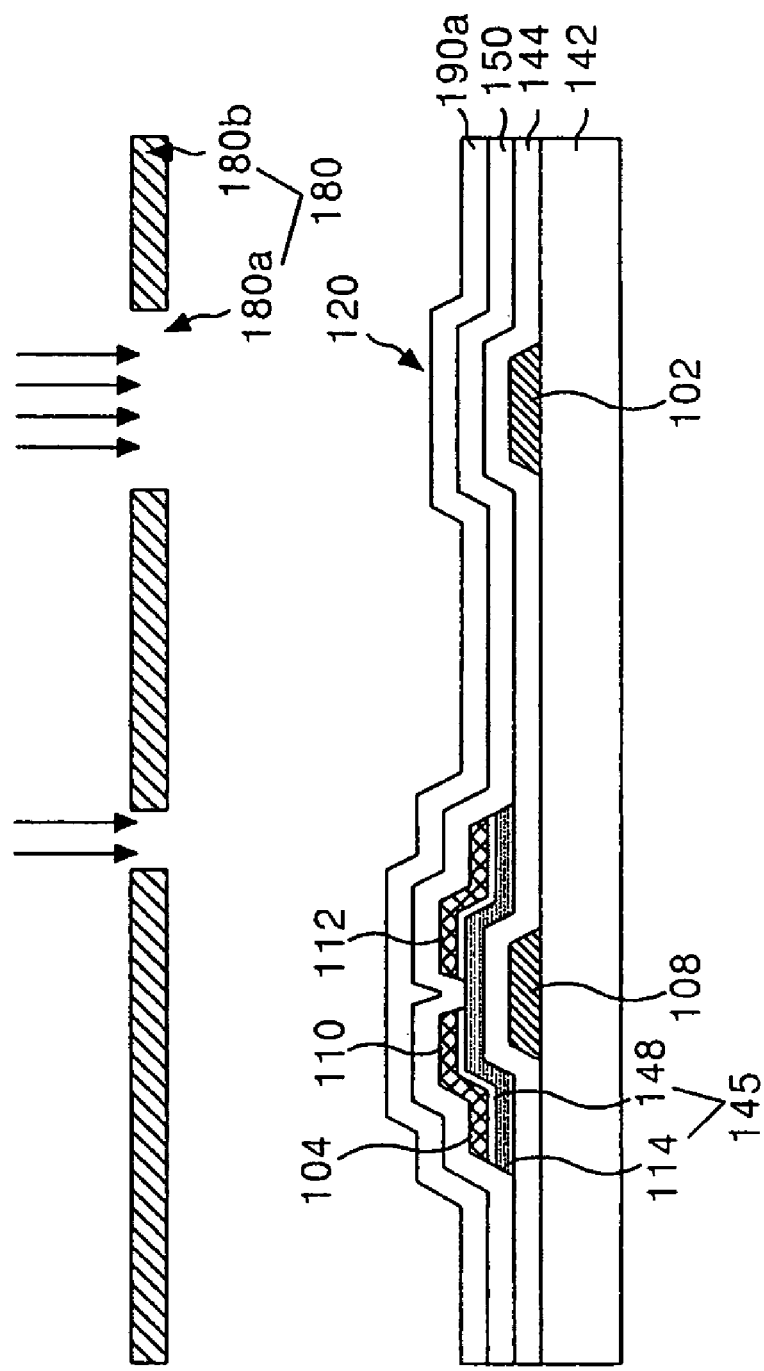

Referring to FIG. 7A, after the protective film 150 is formed on the entire lower substrate 142, a photo-resist 190a is entirely coated thereon. Then, after a mask 180 including a transmitting area 180a and a shielding area 180b is aligned, the photo-resist 190a under the transmitting area 180a is exposed to radiation.

Figure 6B:
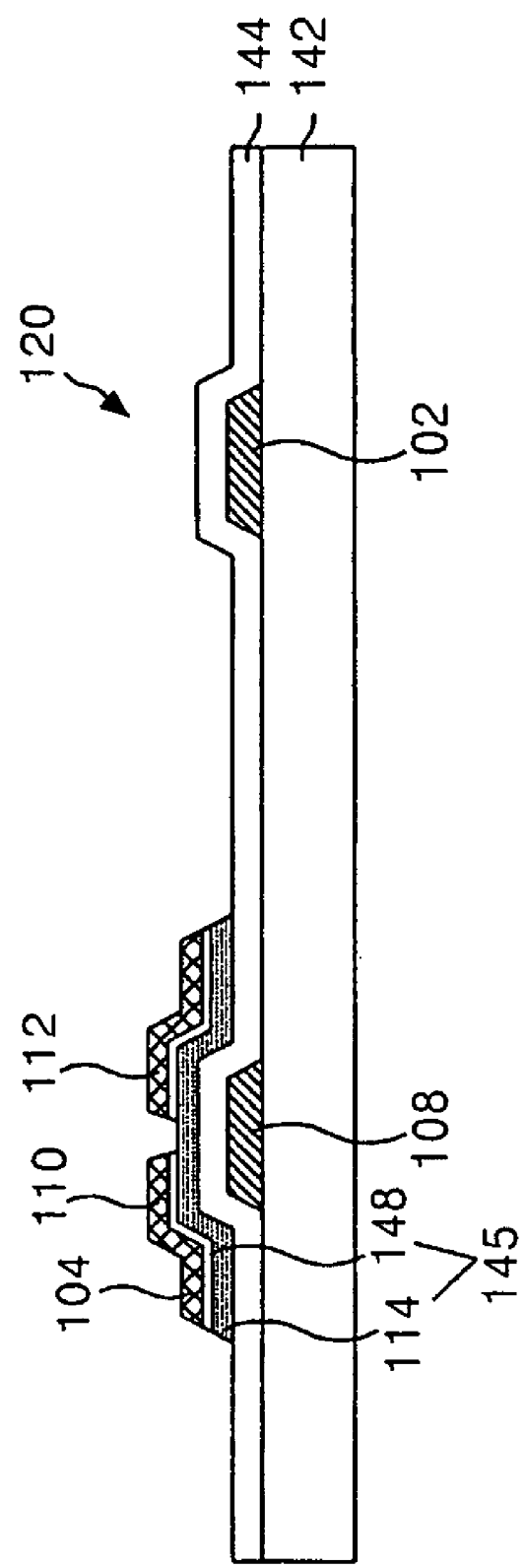
FIG. 6A to FIG. 7B are section views illustrating a method of fabricating the thin film transistor substrate according to a first embodiment of the present invention.
Figure 6C:
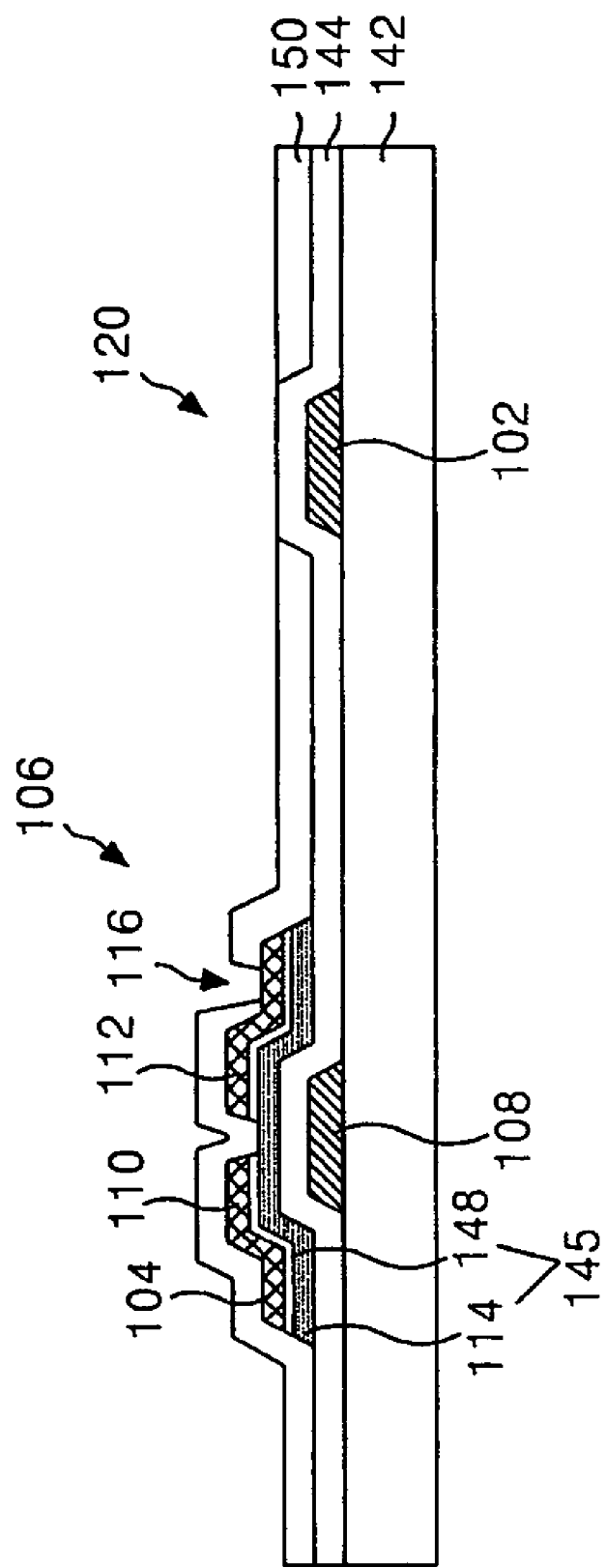
Figure 7B:
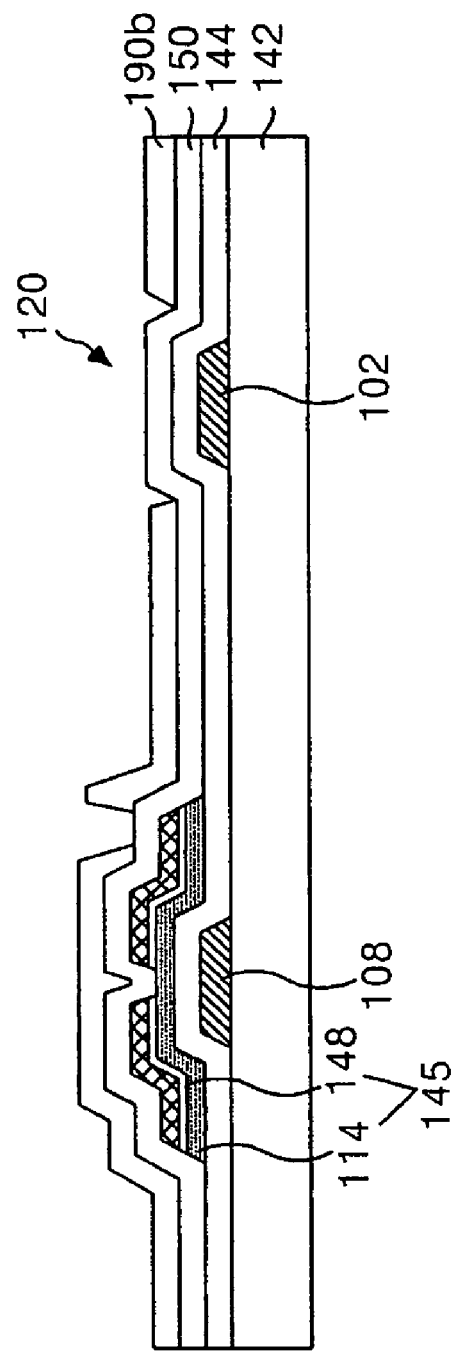

Next, as shown in FIG. 7B, after a photo-resist pattern 190b is formed by development of the photo-resist 190a, the protective film 150 is patterned by utilizing the photo-resist pattern as a mask. Thus, as shown in FIG. 6C, a contact hole 116 is defined to expose the drain electrode 112 of the thin film transistor 106. Also, the protective film 150 is removed at an area where the storage capacitor 120 is positioned, thereby exposing the gate insulating film 144.

The protective film 150 is made from an inorganic insulating material identical to the gate insulating film 144, or an organic insulating material such as an acrylic organic compound having a small dielectric constant, BCB (benzocyclobutene) or PFCB (perfluorocyclobutane), etc.

A transparent electrode material is entirely deposited onto the protective film 150 by a deposition technique such as sputtering, etc. Thereafter, the transparent electrode material is patterned by photolithography and etching using a fourth mask to thereby provide transparent electrode patterns including the pixel electrode 118. The pixel electrode 118 is electrically connected, via a contact hole 116, to the drain electrode 112. Also, the storage capacitor 120 consists of a pixel electrode 118 overlapping a pre-stage gate line 102 with the gate insulating film 144 therebetween. The transparent electrode material is selected from indium-tin-oxide (ITO), tin-oxide (TO), indium-zinc-oxide (IZO) or the like.

As described above, in the first embodiment of the present invention, the protective film 150 is removed from the storage capacitor 120 to thereby increase a capacitance of the storage capacitor 120. Accordingly, a feed-through voltage $\Delta Vp$ is minimized. Thus, a residual image problem such as flicker can be minimized to improve the picture quality.

Figure 8:
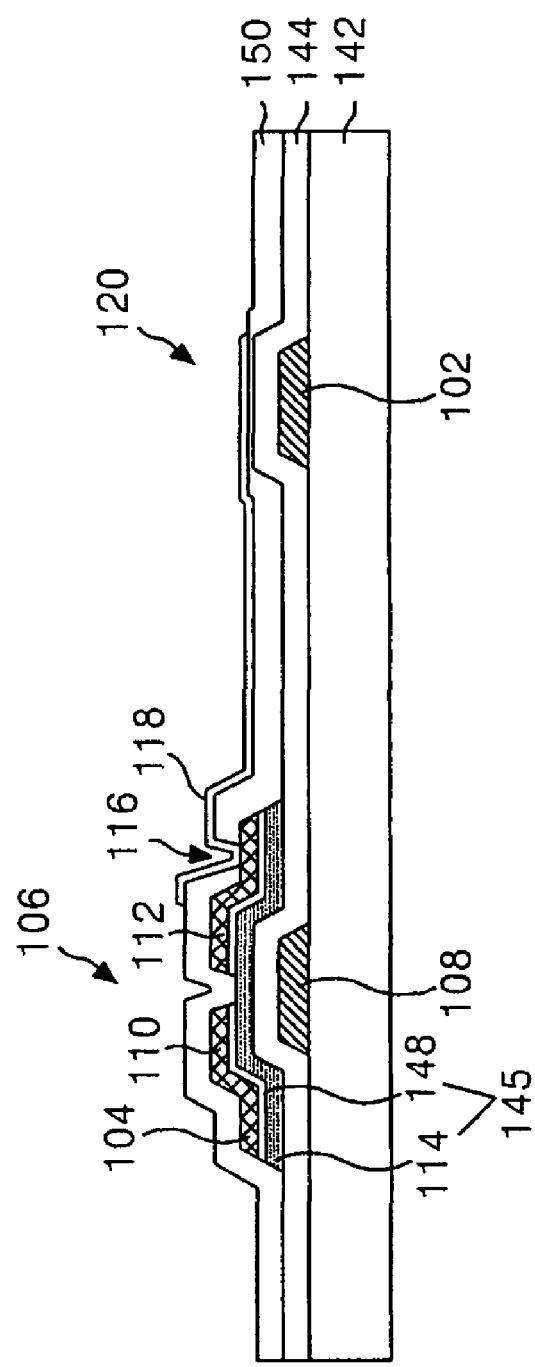
FIG. 8 is a section view showing a portion of a thin film transistor array substrate according to a second embodiment of the present invention.

FIG. 8 is a section view showing a structure of a thin film transistor array substrate according to a second embodiment of the present invention.

The thin film transistor substrate shown in FIG. 8 has the same elements as the thin film transistor substrate shown in FIG. 5 except that the protective film 150 is partially removed within the storage capacitor 120 to have a low height. Therefore, the same elements in FIG. 8 are given the same reference numerals as those in FIG. 5. Further, an explanation as to the same elements will be omitted. The protective film 150 includes a contact hole 116 for exposing the drain electrode 112 of the thin film transistor 106, and has a lower height than the prior art within the storage capacitor 120.

Accordingly, as a distance between the pixel electrode 118 and the gate electrode 102 is reduced, a capacitance value Cst of the storage capacitor 120 is increased. As a result, a feed-through voltage $\Delta Vp$ is minimized. Thus, a residual image problem such as flicker can be minimized to improve the picture quality.

According to the second embodiment of the present invention, the height of the protective film 150 within the storage capacitor 120 can be adjusted by forming the protective film 150 using a diffractive exposure mask. Thus, it becomes possible to increase a capacitance Cst of the storage capacitor 120. Also, it becomes possible to provide the storage capacitor 120 having a desired capacitance value. Herein, the height of the protective film 150 in the storage capacitor 120 is controlled by controlling the etching time.

Figure 9B:
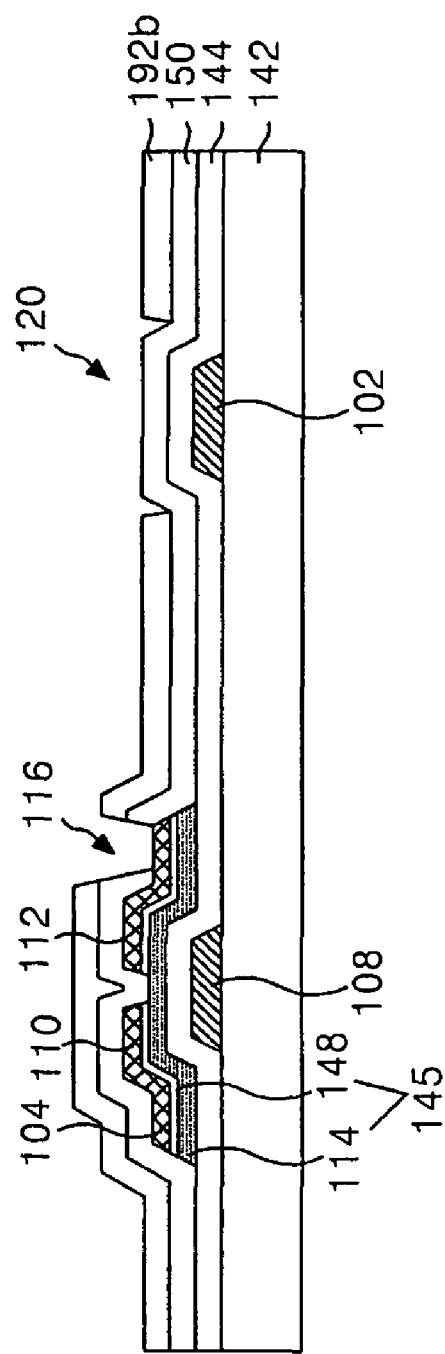
Figure 9C:
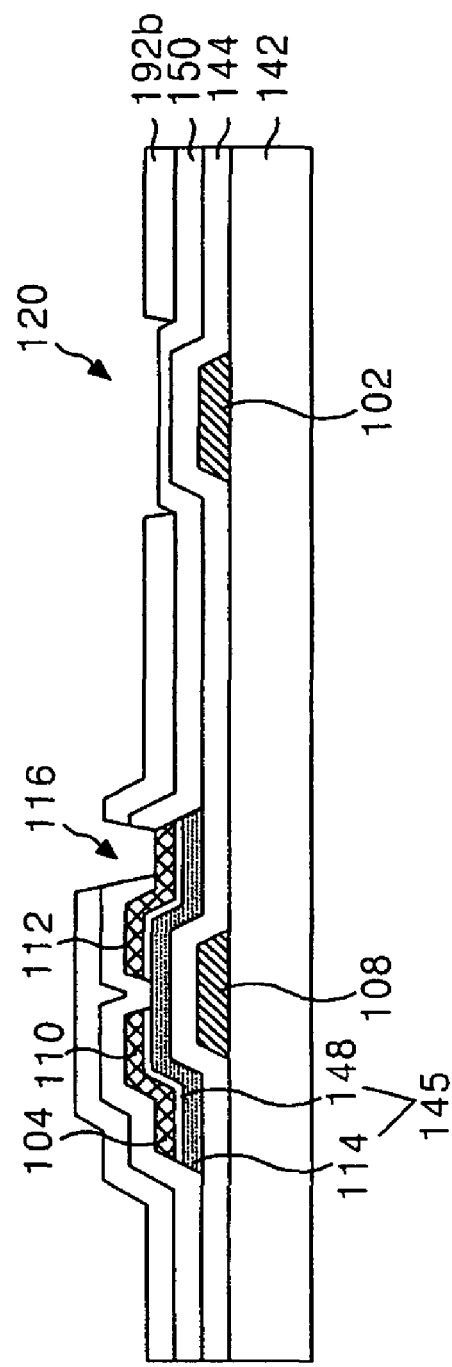

FIG. 9A to FIG. 9C are views for explaining a thin film transistor array substrate and a fabricating method thereof according to the second embodiment of the present invention.

A method of fabricating the thin film transistor substrate according to the second embodiment of the present invention is identical to a method of fabricating the thin film transistor array substrate according to the first embodiment of the present invention as shown FIG. 6A to FIG. 6D except that the contact hole 116 for exposing the drain electrode 112 of the thin film transistor 106 is positioned and the partially removed protective film 150 is located within the storage capacitor 120 by forming the protective film 150 using a diffractive exposure mask. Therefore, an explanation as to the same elements will be omitted.

Referring to FIG. 9A, the protective film 150 and the photo-resist are sequentially provided on the lower substrate 142 provided with the thin film transistor etc. Thereafter, the photo-resist pattern 192a is provided by exposure and development after a diffractive exposure mask 182 including a transmitting part 182a, a shielding part 182b and a semi-transmitting part 182c was aligned. Herein, the protective film 150 is exposed at an area where the contact hole 116 is to be defined, and has a relatively low height (A area in the drawing) at an area where the protective film 150 having a low thickness in the storage capacitor 120 is to be positioned.

The protective film 150 is patterned by utilizing the photo-resist pattern 192a as a mask to thereby provide a contact hole 116 exposing a drain electrode 112 of the thin film transistor 106. Next, ashing is carried out to expose the protective film 150 to be included in the storage capacitor 120 through the remaining photo-resist pattern 192b as shown in FIG. 9B. Further, the exposed protective film 150 is etched (dry etched) by utilizing the remaining photo-resist pattern 192b as a mask to thereby leave the protective film 150 having a lower height than the protective film 150 at the area excluding the storage capacitor 129 as shown in FIG. 9C. Herein, the thickness of the remaining protective film 150 is adjusted by adjusting the etching time. Thereafter, the remaining photo-resist pattern 192b is removed by stripping to thereby provide the partially removed protective film 150.

Figure 10:
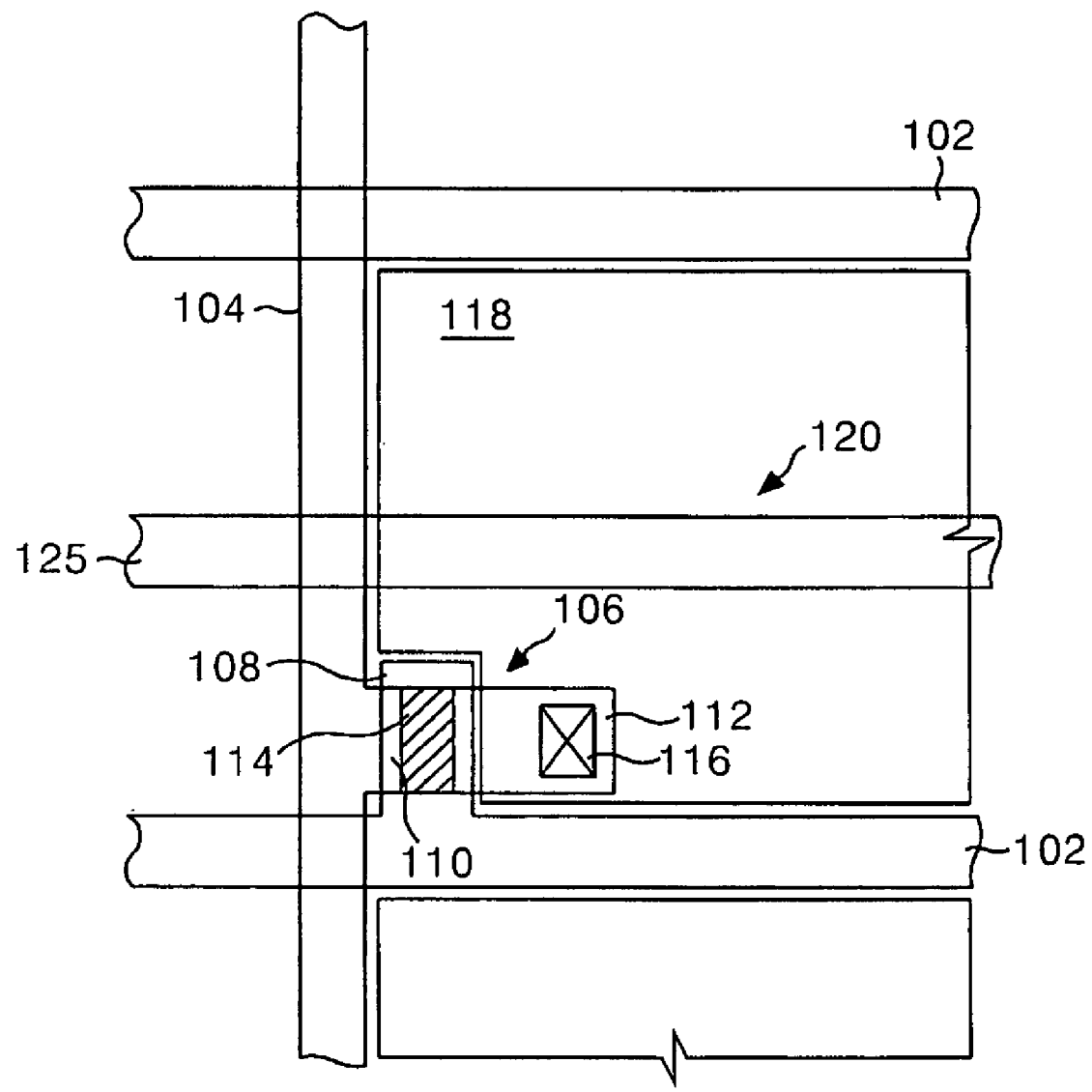
FIG. 10 is a plan view showing a film transistor array substrate according to a third embodiment of the present invention.

FIG. 10 is a plan view showing a film transistor array substrate according to a third embodiment of the present invention;

The thin film transistor array substrate shown in FIG. 10 is a thin film transistor array substrate of storage on common type in which the storage capacitor 120 is provided in such a manner to cross the pixel electrode 118.

Such a thin film transistor array substrate of storage on common type has the same elements as the thin film transistor array substrate shown in FIG. 5 except that it crosses the pixel electrode 118 and is parallel with the gate line 102. In addition, a common line 125 supplied with a reference voltage is provided upon driving the liquid crystal. The storage capacitor 120 is defined by the common line 125 and the pixel electrode 118. Therefore, the same elements will be given by the same reference numerals, and a detailed explanation as to the same elements will be omitted. The thin film transistor array substrate according to the third embodiment of the present invention has a storage capacitor 120 that crosses a pixel area, that is, an area at which the pixel electrode is positioned.

In the thin film transistor array substrate, the protective film 150 is completely or partially removed within the storage capacitor 120 to have a low height like the first and second embodiments of the present invention. In the third embodiment, the storage capacitor 120 is defined by the common line 125 and the pixel electrode 118 rather than the gate line 102.

As described above, the storage-on-common type thin film transistor array substrate according to the third embodiment of the present invention is formed such that the protective film is completely or partially removed within the storage capacitor. Accordingly, a distance between the pixel electrode 118 and the gate electrode 102 is reduced to increase a capacitance Cst of the storage capacitor 120. As a result, a feed-through voltage $\Delta Vp$ is minimized. Thus, a residual image problem such as flicker can be minimized to improve the picture quality.

Herein, when the protective film 150 is partially removed within the storage capacitor 120, the diffractive mask 182 is used. Accordingly, it becomes possible to increase a capacitance Cst of the storage capacitor 120. Also, it becomes possible to provide a storage capacitor 120 having a desired capacitance value.

In the method of fabricating the thin film transistor substrate according to the third embodiment of the present invention, a gate pattern such as the gate line 102 is formed simultaneously with the common line 125. When the protective film is completely removed from the storage capacitor 120, the same method as shown in FIG. 7A to FIG. 7B is used. On the other hand, when the protective film 150 is partially removed from the storage capacitor 120, the gate line 102 and the common line 125 are formed by the same method as the patterning process including photolithographic, ashing, etching processes, etc employing the diffractive exposure mask 182 shown FIG. 9A to FIG. 9C. Accordingly, the detailed description as to this will be omitted.

As described above, according to the present invention, the protective film within the storage capacitor is completely or partially removed, thereby increasing a capacitance of the storage capacitor. Accordingly, a feed-through voltage ΔVp is minimized. Thus, a residual image problem such as flicker can be minimized to improve the picture quality.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a thin film transistor array substrate with a thinned protective film over a storage capacitor, the method comprising:

forming a first gate line and one of a common line and a second gate line separated from the first gate line on a substrate;

forming a source/drain pattern including a data line crossing the first gate line, source and drain electrodes of a thin film transistor provided at the intersection between the first gate line and the data line, and forming a semiconductor pattern including an active layer and an ohmic contact layer of the thin film transistor;

forming a protective film covering the thin film transistor;

forming a photo-resistive film on the protective film;

aligning a diffractive mask including a semi-transmitting part corresponding to a storage capacitor area and a transmitting part corresponding to a contact hole area;

forming a photo-resist pattern using the diffractive mask, wherein the photo-resist pattern on the storage capacitor area has a lower height than the photo-resist pattern of an area excluding the storage capacitor area, the photo resist pattern corresponding to the contact hole area being removed to expose the protective film;

patterning the protective film using the photo-resist pattern as a mask to remove the protective film corresponding to the contact hole area to define a contact hole to expose the drain electrode, the protective film at the storage capacitor area remaining unaffected when the contact hole is formed;

ashing the photo-resist pattern at the storage capacitor area to expose the protective film, the ashed photo-resist pattern remaining at an area excluding the contact hole and the storage capacitor area;

partially removing the protective film at the storage capacitor area using the ashed photo-resist pattern as a mask to reduce a height of the protective film at the storage capacitor area, the height of the protective film being based on an etching time;

removing the ashed photo-resist pattern; and forming a pixel electrode connected, via the contact hole, to the drain electrode of the thin film transistor, a storage capacitor being formed that includes the pixel electrode and the one of the common line and the second gate line;

wherein forming the source/drain pattern and forming the semiconductor pattern comprises:

forming an amorphous silicon layer, an n+ amorphous silicon layer and a source/drain metal layer on the substrate;

forming a photo-resist pattern having a lower height at a channel portion of the thin film transistor than at regions of the source/drain pattern;

etching the source/drain metal layer using the photo-resist pattern to provide the data line, the source electrode, and the drain electrode;

etching the amorphous silicon layer and the n+ amorphous silicon layer using the photo-resist pattern to provide the active layer and the ohmic contact layer;

ashing the photo-resist pattern;

etching the source/drain pattern and the ohmic contact layer at the channel portion using the ashed photo-resist pattern.

2. The method of fabricating the thin film transistor array substrate as claimed in claim 1, further comprising forming a gate insulating film that covers at least one of the common line and the second gate line.

3. The method of fabricating the thin film transistor array substrate as claimed in claim 1, wherein the protective film covering the thin film transistor is not substantially thinned during removal of the portion of the protective film.

4. The method of fabricating the thin film transistor array substrate as claimed in claim 1, wherein one of the common line and the second gate line crosses the pixel electrode.

5. The method of fabricating thin film transistor array substrate as claimed in claim 1, further comprising forming a gate insulating film in the storage capacitor.

6. The method of fabricating thin film transistor array substrate as claimed in claim 5, wherein both the gate insulating film and the protective film are disposed in the storage capacitor.

7. The method of fabricating thin film transistor array substrate as claimed in claim 5, wherein, in the storage capacitor, the pixel electrode contacts the protective film and the gate insulating film contacts one of the common line and the second gate line.

8. The method of fabricating thin film transistor array substrate as claimed in claim 1, wherein the substrate is a transparent substrate.

* * * * *